US010887396B2

United States Patent
Manweiler et al.

(10) Patent No.: US 10,887,396 B2
(45) Date of Patent: Jan. 5, 2021

(54) SENSOR DATA MANIPULATION USING EMULATION

(71) Applicant: International Business Machines Corporation, Armonk, NY (US)

(72) Inventors: Justin Gregory Manweiler, Somers, NY (US); Hani Jamjoom, Cos Cob, CT (US); David Lubensky, Brookfield, CT (US); Anni Coden, Bronx, NY (US); Justin Weisz, Scarsdale, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/242,447

(22) Filed: Jan. 8, 2019

(65) Prior Publication Data

US 2020/0220930 A1     Jul. 9, 2020

(51) Int. Cl.
*H04L 29/08* (2006.01)
*H04L 29/06* (2006.01)
*G01R 13/02* (2006.01)

(52) U.S. Cl.
CPC .......... *H04L 67/12* (2013.01); *G01R 13/0272* (2013.01); *H04L 67/125* (2013.01); *H04L 69/08* (2013.01)

(58) Field of Classification Search
CPC ....... H04L 67/12; H04L 69/08; H04L 67/125; G01R 13/0272
See application file for complete search history.

(56) References Cited

U.S. PATENT DOCUMENTS

| 8,572,155 | B2 | 10/2013 | Yanovich et al. |
| 2014/0282425 | A1* | 9/2014 | Zhao ............... G06F 11/3688 717/127 |
| 2015/0206682 | A1 | 7/2015 | Sala et al. |
| 2015/0365842 | A1* | 12/2015 | Bellusci ........... H04W 28/0252 370/230 |
| 2016/0142160 | A1* | 5/2016 | Walker ................ H04L 67/12 702/104 |
| 2018/0095133 | A1* | 4/2018 | Kealy ............... G01R 31/343 |

(Continued)

FOREIGN PATENT DOCUMENTS

WO     2015099687 A1     7/2015

OTHER PUBLICATIONS

Oracle, Developing Applications with Oracle Internet of Things Cloud Service, 2018.

(Continued)

*Primary Examiner* — Michael A Keller
(74) *Attorney, Agent, or Firm* — Garg Law Firm, PLLC; Rakesh Garg; Anthony Curro

(57) ABSTRACT

From a hardware sensor at a first time, sensor data comprising a first sample and a second sample is received. The sensor data is modified to create new data, wherein a first data point of the new data corresponds to the first sample, a second data point of the new data corresponds to the second sample, and wherein the first data point and the second data point are arranged differently from the first sample and the second sample. The hardware sensor is emulated by sending, to a consumer of hardware sensor data at a second time, the new data instead of the sensor data.

11 Claims, 12 Drawing Sheets

(56) References Cited

U.S. PATENT DOCUMENTS

| | | | |
|---|---|---|---|
| 2018/0188051 A1* | 7/2018 | Gaspard-Boulinc | ........................ G08G 5/0039 |
| 2019/0057307 A1* | 2/2019 | Zheng | ...................... G06N 3/08 |
| 2019/0235521 A1* | 8/2019 | Mudalige | .............. G01S 13/865 |

OTHER PUBLICATIONS

Zeinab Farahmandpour et al., Service Virtualisation of Internet-of-Things Devices: Techniques and Challenges, May 16, 2016.
Jeong Gil Ko et al., Sensor or Virtualization Module: Virtualizing IoT Devices on Mobile Smartphone for Effective Sensor Data Management, Oct. 4, 2015.

\* cited by examiner

SENSOR DATA MANIPULATION USING EMULATION

TECHNICAL FIELD

The present invention relates generally to a method, system, and computer program product for sensor data emulation. More particularly, the present invention relates to a method, system, and computer program product for sensor data manipulation using emulation.

BACKGROUND

Sensors capable of performing a measurement and reporting that measurement to an application are becoming ubiquitous. Cameras and microphones are well known, but many other types of sensors are also available. For example, location sensors determine a location on the Earth's surface, barometers measure air pressure, altimeters measure altitude, motion sensors detect and measure motion, accelerometers measure acceleration, and gyroscopes are usable to determine orientation. Distance sensors measure a distance from an object to the sensor. Temperature sensors measure temperature. Heart rate sensors, blood pressure sensors, blood oxygenation sensors, sleep cycle monitors, skin sweat sensors, and the like measure, with appropriate permission, health-related data.

As used herein, a sensor produces a time series of samples, measurements, or other sensor data. For example, a temperature sensor configured to measure the temperature of an office conference room might report a sample of 20 degrees Celsius during office hours, and a sample of 15 degrees Celsius during non-office hours, such as when building heat has been turned down for the night.

A sensor reports data to an application consuming sensor data. The sensor reports data to the application using a direct data connection. Alternatively, a sensor reports data to the application using a wireless communications protocol. For example, a sensor communicates directly with a nearby device using a wired connection, wirelessly using Bluetooth or Near Field Communication, or to any device over a network such as the Internet using cellular data, Wi-Fi, or another wireless communications protocol. (Bluetooth is a registered trademark of Bluetooth SIG, Inc. Wi-Fi is a registered trademark of Wi-Fi Alliance.)

SUMMARY

The illustrative embodiments provide a method, system, and computer program product. An embodiment includes a method that receives, from a hardware sensor at a first time, sensor data comprising a first sample and a second sample. An embodiment modifies, to create new data, the sensor data, wherein a first data point of the new data corresponds to the first sample, a second data point of the new data corresponds to the second sample, and wherein the first data point and the second data point are arranged differently from the first sample and the second sample. An embodiment emulates the hardware sensor by sending, to a consumer of hardware sensor data at a second time, the new data instead of the sensor data.

An embodiment includes a computer usable program product. The computer usable program product includes one or more computer-readable storage devices, and program instructions stored on at least one of the one or more storage devices.

An embodiment includes a computer system. The computer system includes one or more processors, one or more computer-readable memories, and one or more computer-readable storage devices, and program instructions stored on at least one of the one or more storage devices for execution by at least one of the one or more processors via at least one of the one or more memories.

BRIEF DESCRIPTION OF THE DRAWINGS

Certain novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

Figure 1:
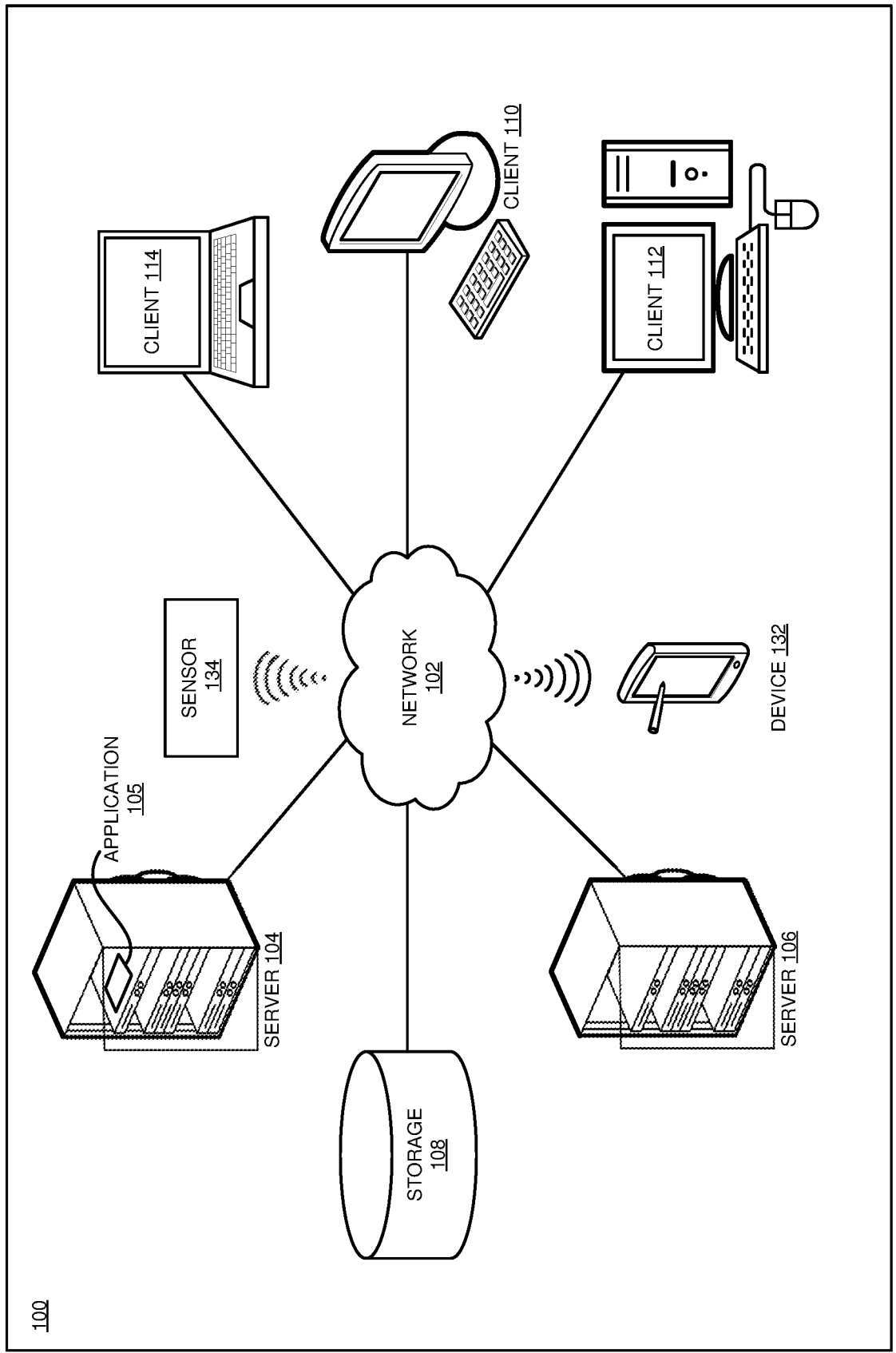
FIG. 1 depicts a block diagram of a network of data processing systems in which illustrative embodiments may be implemented.

The illustrative embodiments recognize that, when a sensor sends data to a consuming application, there is no opportunity to modify the sensor data independently of the sensor and the consuming application. However, there is a need to modify the sensor data independently of the sensor and the consuming application.

The illustrative embodiments recognize that an implementer may need to validate the consuming application, testing the application with a variety of data representing different conditions the application should detect and act upon. However, data representing some conditions may be difficult to collect. For example, a condition may be too infrequent, expensive, time-consuming, or risky to create for testing purposes, or data representing the condition may not include all variations that the application should be tested against. Thus, it may be more convenient, less expensive, or result in a more comprehensive validation to use some collected sensor data as a basis for intelligently synthesizing additional sensor data.

The illustrative embodiments recognize that an implementer may need to validate a new sensor against the consuming application, testing that the application functions correctly with data from the new sensor. Here too it may be more convenient, less expensive, or result in a more comprehensive validation to use some collected sensor data as a basis for emulating one or more types of sensors or emulating additional sensor data.

The illustrative embodiments recognize a need to forward sensor data to multiple consuming applications, with differing input data requirements. The illustrative embodiments also recognize a need to store sensor data for later playback, optionally in an altered form.

The illustrative embodiments recognize that the presently available tools or solutions do not address these needs or provide adequate solutions for these needs. The illustrative embodiments used to describe the invention generally address and solve the above-described problems and other problems related to sensor data manipulation using emulation.

An embodiment can be implemented as a software application. The application implementing an embodiment can be configured as a modification of an existing system supplying sensor data, as an existing system consuming sensor data, as a separate application that operates in conjunction with an existing system supplying or consuming sensor data, a standalone application, or some combination thereof.

Particularly, some illustrative embodiments provide a method by which hardware sensor data can be received and modified, and the hardware sensor emulated by sending sensor data, either modified from received data or synthesized, to a consuming application without the consuming application being aware of the intervention.

An embodiment receives data from a hardware sensor for processing. The sensor data is in the form of a time series of samples, measurements, or other data produced by the hardware sensor. For example, a temperature sensor supplies a time series of temperature measurements to an embodiment.

An embodiment modifies the data received from the hardware sensor, to create new data. An embodiment modifies the received data by changing a measurement. One embodiment adds a perturbation to the value of a measurement. Adding a perturbation simulates an effect of noise, interference, or another phenomenon that degrades measurement quality. For example, an effect of substituting a less expensive, less sensitive, or lower bandwidth sensor for a more expensive, more sensitive, or higher bandwidth can be simulated by adding a random value to or subtracting a random value from sensor data, and supplying the resulting modified sensor data to a consuming application in the place of the original sensor data.

Another embodiment removes a perturbation from the value of a measurement. Removing a perturbation simulates removing noise, interference, or another phenomenon from a measurement, thus improving measurement quality. For example, an effect of substituting a more expensive, more sensitive, or higher bandwidth sensor for a less expensive, less sensitive, or lower bandwidth sensor can be simulated by filtering or otherwise removing noise from original sensor, and supplying the resulting modified sensor data to a consuming application in the place of the original sensor data.

An embodiment modifies received sensor data by changing a format of a measurement within the sensor data. Changing a format in this manner allows substitution of a sensor supplying measurement data in one format with a sensor supplying measurement data in a different format, without modifying the consuming application. Substituting a sensor allows an implementer to use, for example, a less expensive sensor or a sensor with improved availability, in the place of the original sensor.

An embodiment modifies the received data by removing a sample or data point from the time-series of the received data. One embodiment removes a specific proportion of the total number of samples, in an evenly distributed manner. Removing a specific proportion of samples, in an evenly distributed manner, simulates replacing a sensor having a particular sampling rate with a sensor having a lower sampling rate than the first sensor. For example, to simulate replacing a sensor that takes a measurement at 60 Hz with a sensor that takes a measurement at 30 Hz, an embodiment removes every other measurement.

Another embodiment removes all samples in a particular time period. This type of removal simulates an effect of a sensor failing to produce data in the time period. For example, a wearable sensor may be worn too loosely, resulting in a time period in which a measurement is taken and another time period in which the sensor is too far away from the measurement subject to obtain a valid measurement. As another example, a hardware failure may prevent a sensor from reporting data for a period of time.

Another embodiment removes only some samples from within a time period. Another embodiment removes samples in an unevenly distributed manner. Other sample removal schemes are also possible and contemplated within the scope of the illustrative embodiments.

An embodiment modifies the received data by adding a sample or data point to the time-series of the received data. One embodiment adds a specific proportion of the total number of samples, in an evenly distributed manner. Adding a specific proportion of samples, in an evenly distributed manner, simulates replacing a sensor having a particular sampling rate with a sensor having a higher sampling rate than the first sensor. For example, to simulate replacing a sensor that takes a measurement at 30 Hz with a sensor that takes a measurement at 60 Hz, an embodiment adds a sample representing a simulated or emulated measurement at a time halfway between every existing measurement.

Another embodiment adds a measurement at a particular time or within a particular time period. This type of addition allows the introduction of created sensor data for a time period for the consuming application to process. Introducing created data compensates for missing data (for example, data from a sensor that was temporarily unable to take a measurement) or simulates an event (for example, an event for which it is too difficult, too expensive, too risky, or too infrequent to collect actual data).

Another embodiment adds only some samples from within a time period. Another embodiment adds samples in an unevenly distributed manner. Other sample addition schemes are also possible and contemplated within the scope of the illustrative embodiments.

An embodiment modifies the received data by changing a time interval between two samples or modifying a timestamp associated with a sample. Expanding a time interval between two samples simulates an effect of lowering a frequency at which a sensor takes measurements. Contracting a time interval between two samples simulates an effect of raising a frequency at which a sensor takes measurements. Modifying a timestamp associated with a sample simulates an effect of taking measurements at a different time—for example, changing a daytime measurement to a nighttime measurement, or changing a weekday measurement to a weekend measurement.

An embodiment stores sensor data, then modifies the stored data and supplies the modified data to a consuming application. Another embodiment modifies sensor data as the sensor data is received, then stores the modified data for supply to a consuming application at a later time.

An embodiment sends the modified data to more than one consuming application, either simultaneously or at different times. An embodiment is also configurable to send different sets of modified data, including different modifications, to different consuming applications.

An embodiment records which data was supplied to which consuming application. Such records of data consumption are useful in constructing an audit trail of data use, for example to conform with data usage agreements, governmental requirements, or other data usage considerations.

The manner of sensor data manipulation using emulation described herein is unavailable in the presently available methods in the technological field of endeavor pertaining to sensor data collection and management. A method of an embodiment described herein, when implemented to execute on a device or data processing system, comprises substantial advancement of the functionality of that device or data processing system in modifying sensor data independently of a consuming application.

The illustrative embodiments are described with respect to certain types of adjustments, rearrangements, removals, additions, samples, sampling rates, sensors, measurements, devices, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

Furthermore, the illustrative embodiments may be implemented with respect to any type of data, data source, or access to a data source over a data network. Any type of data storage device may provide the data to an embodiment of the invention, either locally at a data processing system or over a data network, within the scope of the invention. Where an embodiment is described using a mobile device, any type of data storage device suitable for use with the mobile device may provide the data to such embodiment, either locally at the mobile device or over a data network, within the scope of the illustrative embodiments.

The illustrative embodiments are described using specific code, designs, architectures, protocols, layouts, schematics, and tools only as examples and are not limiting to the illustrative embodiments. Furthermore, the illustrative embodiments are described in some instances using particular software, tools, and data processing environments only as an example for the clarity of the description. The illustrative embodiments may be used in conjunction with other comparable or similarly purposed structures, systems, applications, or architectures. For example, other comparable mobile devices, structures, systems, applications, or architectures therefor, may be used in conjunction with such embodiment of the invention within the scope of the invention. An illustrative embodiment may be implemented in hardware, software, or a combination thereof.

The examples in this disclosure are used only for the clarity of the description and are not limiting to the illustrative embodiments. Additional data, operations, actions, tasks, activities, and manipulations will be conceivable from this disclosure and the same are contemplated within the scope of the illustrative embodiments.

Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
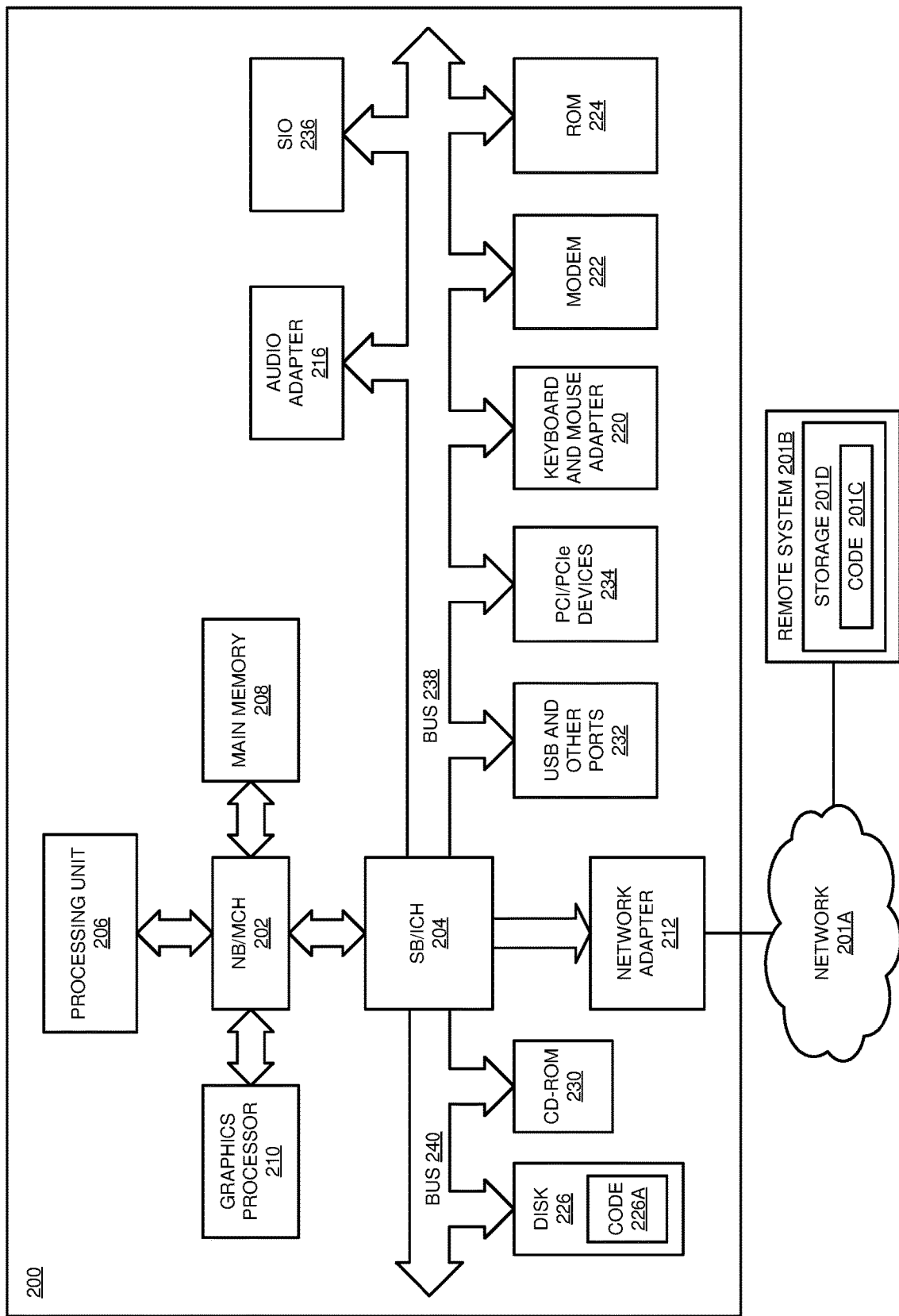
FIG. 2 depicts a block diagram of a data processing system in which illustrative embodiments may be implemented.

With reference to the figures and in particular with reference to FIGS. 1 and 2, these figures are example diagrams of data processing environments in which illustrative embodiments may be implemented. FIGS. 1 and 2 are only examples and are not intended to assert or imply any limitation with regard to the environments in which different embodiments may be implemented. A particular implementation may make many modifications to the depicted environments based on the following description.

FIG. 1 depicts a block diagram of a network of data processing systems in which illustrative embodiments may be implemented. Data processing environment 100 is a network of computers in which the illustrative embodiments may be implemented. Data processing environment 100 includes network 102. Network 102 is the medium used to provide communications links between various devices and computers connected together within data processing environment 100. Network 102 may include connections, such as wire, wireless communication links, or fiber optic cables.

Clients or servers are only example roles of certain data processing systems connected to network 102 and are not intended to exclude other configurations or roles for these data processing systems. Server 104 and server 106 couple to network 102 along with storage unit 108. Software applications may execute on any computer in data processing environment 100. Clients 110, 112, and 114 are also coupled to network 102. A data processing system, such as server 104 or 106, or client 110, 112, or 114 may contain data and may have software applications or software tools executing thereon.

Only as an example, and without implying any limitation to such architecture, FIG. 1 depicts certain components that are usable in an example implementation of an embodiment. For example, servers 104 and 106, and clients 110, 112, 114, are depicted as servers and clients only as example and not to imply a limitation to a client-server architecture. As another example, an embodiment can be distributed across several data processing systems and a data network as shown, whereas another embodiment can be implemented on a single data processing system within the scope of the illustrative embodiments. Data processing systems 104, 106, 110, 112, and 114 also represent example nodes in a cluster, partitions, and other configurations suitable for implementing an embodiment.

Device 132 is an example of a device described herein. For example, device 132 can take the form of a smartphone, a tablet computer, a laptop computer, client 110 in a stationary or a portable form, a wearable computing device, or any other suitable device. Any software application described as executing in another data processing system in FIG. 1 can be configured to execute in device 132 in a similar manner. Any data or information stored or produced in another data processing system in FIG. 1 can be configured to be stored or produced in device 132 in a similar manner.

Sensor 134 is an example of a sensor described herein. For example, sensor 134 can take the form of a camera, microphone, location sensor, barometer, altimeter, motion sensor, accelerometer, gyroscope, distance sensor, temperature sensor, heart rate sensor, blood pressure sensor, sleep cycle monitor, skin sweat sensor, or another suitable device. Sensor 134 communicates measurements directly to device 132 using a wired connection or a suitable wireless communications protocol, or communicates measurements over network 102 to another device, such as servers 104 and 106, clients 110, 112, and 114, and device 132.

Application 105 implements an embodiment described herein. Application 105 receives data from sensor 134, modifies the sensor data, and emulates sensor 134 by sending the modified data to a consuming application. Both Application 105 and the consuming application may execute on any of servers 104 and 106, clients 110, 112, and 114, and device 132. Application 105 may store sensor data, before, during, or after modification, in storage 108.

Servers 104 and 106, storage unit 108, and clients 110, 112, and 114, sensor 134, and device 132 may couple to network 102 using wired connections, wireless communication protocols, or other suitable data connectivity. Clients 110, 112, and 114 may be, for example, personal computers or network computers.

In the depicted example, server 104 may provide data, such as boot files, operating system images, and applications to clients 110, 112, and 114. Clients 110, 112, and 114 may be clients to server 104 in this example. Clients 110, 112, 114, or some combination thereof, may include their own data, boot files, operating system images, and applications. Data processing environment 100 may include additional servers, clients, and other devices that are not shown.

In the depicted example, data processing environment 100 may be the Internet. Network 102 may represent a collection of networks and gateways that use the Transmission Control Protocol/Internet Protocol (TCP/IP) and other protocols to communicate with one another. At the heart of the Internet is a backbone of data communication links between major nodes or host computers, including thousands of commercial, governmental, educational, and other computer systems that route data and messages. Of course, data processing environment 100 also may be implemented as a number of different types of networks, such as for example, an intranet, a local area network (LAN), or a wide area network (WAN). FIG. 1 is intended as an example, and not as an architectural limitation for the different illustrative embodiments.

Among other uses, data processing environment 100 may be used for implementing a client-server environment in which the illustrative embodiments may be implemented. A client-server environment enables software applications and data to be distributed across a network such that an application functions by using the interactivity between a client data processing system and a server data processing system. Data processing environment 100 may also employ a service oriented architecture where interoperable software components distributed across a network may be packaged together as coherent business applications. Data processing environment 100 may also take the form of a cloud, and employ a cloud computing model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service.

With reference to FIG. 2, this figure depicts a block diagram of a data processing system in which illustrative embodiments may be implemented. Data processing system 200 is an example of a computer, such as servers 104 and 106, or clients 110, 112, and 114 in FIG. 1, or another type of device in which computer usable program code or instructions implementing the processes may be located for the illustrative embodiments.

Data processing system 200 is also representative of a data processing system or a configuration therein, such as data processing system 132 in FIG. 1 in which computer usable program code or instructions implementing the processes of the illustrative embodiments may be located. Data processing system 200 is described as a computer only as an example, without being limited thereto. Implementations in the form of other devices, such as device 132 in FIG. 1, may modify data processing system 200, such as by adding a touch interface, and even eliminate certain depicted components from data processing system 200 without departing from the general description of the operations and functions of data processing system 200 described herein.

In the depicted example, data processing system 200 employs a hub architecture including North Bridge and memory controller hub (NB/MCH) 202 and South Bridge and input/output (I/O) controller hub (SB/ICH) 204. Processing unit 206, main memory 208, and graphics processor 210 are coupled to North Bridge and memory controller hub (NB/MCH) 202. Processing unit 206 may contain one or more processors and may be implemented using one or more heterogeneous processor systems. Processing unit 206 may be a multi-core processor. Graphics processor 210 may be coupled to NB/MCH 202 through an accelerated graphics port (AGP) in certain implementations.

In the depicted example, local area network (LAN) adapter 212 is coupled to South Bridge and I/O controller hub (SB/ICH) 204. Audio adapter 216, keyboard and mouse adapter 220, modem 222, read only memory (ROM) 224, universal serial bus (USB) and other ports 232, and PCI/PCIe devices 234 are coupled to South Bridge and I/O controller hub 204 through bus 238. Hard disk drive (HDD) or solid-state drive (SSD) 226 and CD-ROM 230 are coupled to South Bridge and I/O controller hub 204 through bus 240. PCI/PCIe devices 234 may include, for example, Ethernet adapters, add-in cards, and PC cards for notebook computers. PCI uses a card bus controller, while PCIe does not. ROM 224 may be, for example, a flash binary input/output system (BIOS). Hard disk drive 226 and CD-ROM 230 may use, for example, an integrated drive electronics (IDE), serial advanced technology attachment (SATA) interface, or variants such as external-SATA (eSATA) and micro-SATA (mSATA). A super I/O (SIO) device 236 may be coupled to South Bridge and I/O controller hub (SB/ICH) 204 through bus 238.

Memories, such as main memory 208, ROM 224, or flash memory (not shown), are some examples of computer usable storage devices. Hard disk drive or solid state drive 226, CD-ROM 230, and other similarly usable devices are some examples of computer usable storage devices including a computer usable storage medium.

An operating system runs on processing unit 206. The operating system coordinates and provides control of various components within data processing system 200 in FIG. 2. The operating system may be a commercially available operating system for any type of computing platform, including but not limited to server systems, personal computers, and mobile devices. An object oriented or other type of programming system may operate in conjunction with the operating system and provide calls to the operating system from programs or applications executing on data processing system 200.

Instructions for the operating system, the object-oriented programming system, and applications or programs, such as application 105 in FIG. 1, are located on storage devices, such as in the form of code 226A on hard disk drive 226, and may be loaded into at least one of one or more memories, such as main memory 208, for execution by processing unit 206. The processes of the illustrative embodiments may be performed by processing unit 206 using computer implemented instructions, which may be located in a memory, such as, for example, main memory 208, read only memory 224, or in one or more peripheral devices.

Furthermore, in one case, code 226A may be downloaded over network 201A from remote system 201B, where similar code 201C is stored on a storage device 201D. in another case, code 226A may be downloaded over network 201A to remote system 201B, where downloaded code 201C is stored on a storage device 201D.

The hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. In addition, the processes of the illustrative embodiments may be applied to a multiprocessor data processing system.

In some illustrative examples, data processing system 200 may be a personal digital assistant (PDA), which is generally configured with flash memory to provide non-volatile memory for storing operating system files and/or user-generated data. A bus system may comprise one or more buses, such as a system bus, an I/O bus, and a PCI bus. Of course, the bus system may be implemented using any type of communications fabric or architecture that provides for a transfer of data between different components or devices attached to the fabric or architecture.

A communications unit may include one or more devices used to transmit and receive data, such as a modem or a network adapter. A memory may be, for example, main memory 208 or a cache, such as the cache found in North Bridge and memory controller hub 202. A processing unit may include one or more processors or CPUs.

The depicted examples in FIGS. 1-2 and above-described examples are not meant to imply architectural limitations. For example, data processing system 200 also may be a tablet computer, laptop computer, or telephone device in addition to taking the form of a mobile or wearable device.

Where a computer or data processing system is described as a virtual machine, a virtual device, or a virtual component, the virtual machine, virtual device, or the virtual component operates in the manner of data processing system 200 using virtualized manifestation of some or all components depicted in data processing system 200. For example, in a virtual machine, virtual device, or virtual component, processing unit 206 is manifested as a virtualized instance of all or some number of hardware processing units 206 available in a host data processing system, main memory 208 is manifested as a virtualized instance of all or some portion of main memory 208 that may be available in the host data processing system, and disk 226 is manifested as a virtualized instance of all or some portion of disk 226 that may be available in the host data processing system. The host data processing system in such cases is represented by data processing system 200.

Figure 3:
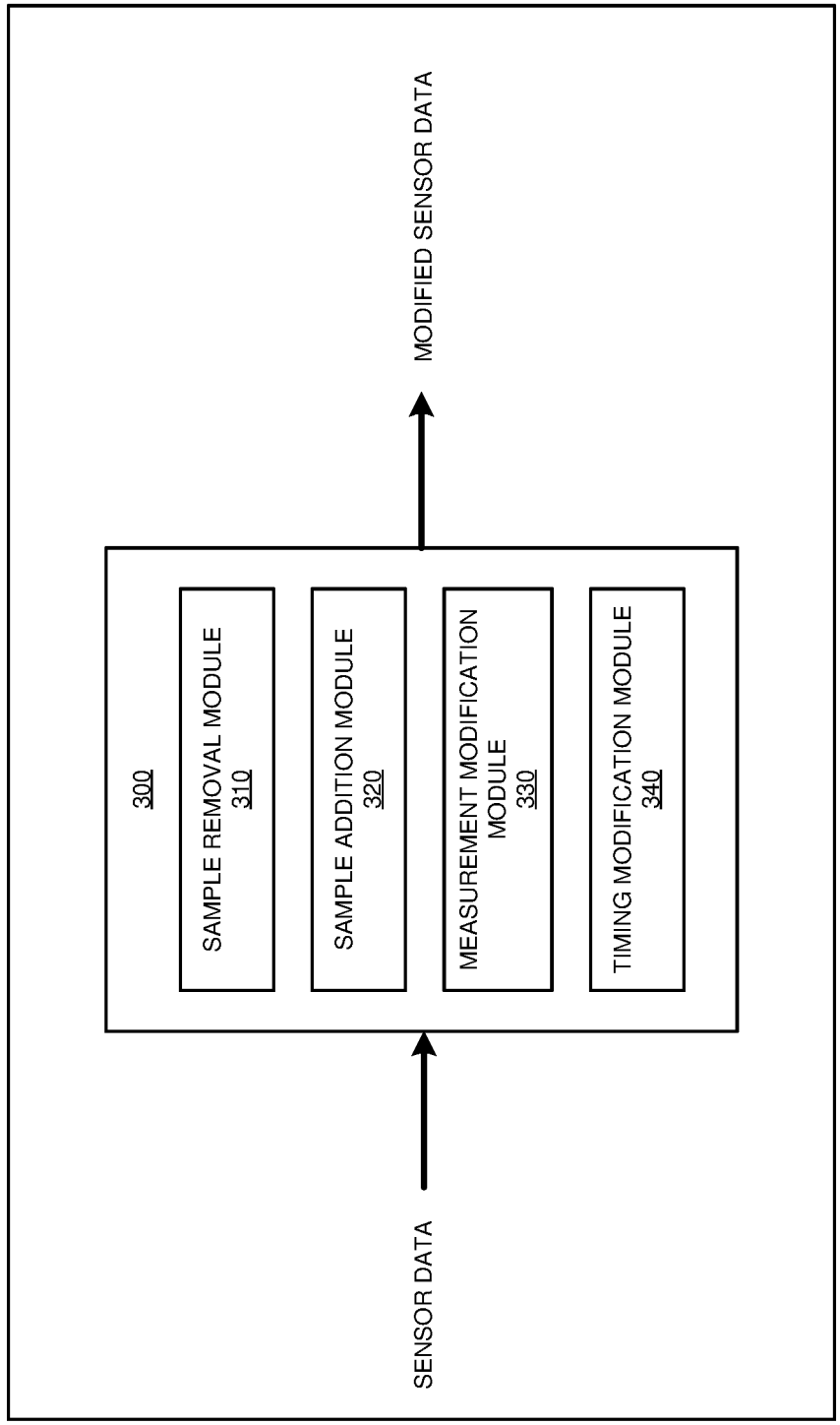
FIG. 3 depicts a block diagram of an example configuration for sensor data manipulation using emulation in accordance with an illustrative embodiment.

With reference to FIG. 3, this figure depicts a block diagram of an example configuration for sensor data manipulation using emulation in accordance with an illustrative embodiment. Application 300 is an example of application 105 in FIG. 1 and executes in any of servers 104 and 106, clients 110, 112, and 114, and device 132 in FIG. 1.

Application 300 receives sensor data from sensor 134 in FIG. 1, and modifies the sensor data to create new data. The new data is a rearrangement of the received data.

Sample removal module 310 modifies the received data by removing a sample. Sample addition module 320 modifies the received data by adding a sample. Measurement modification module 330 changes a measurement. Timing modification module 340 modifies the received data by changing a time interval between two samples or modifying a timestamp associated with a sample.

Figure 4:
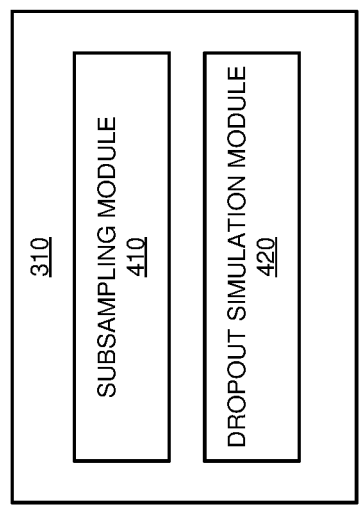
FIG. 4 depicts a block diagram giving more detail of an example configuration for sensor data manipulation using emulation in accordance with an illustrative embodiment.

With reference to FIG. 4, this figure depicts a block diagram giving more detail of an example configuration for sensor data manipulation using emulation in accordance with an illustrative embodiment. FIG. 4 gives more detail of sample deletion module 310 in FIG. 3.

Subsampling module 410 removes a specific proportion of the total number of samples, in an evenly distributed manner. Removing a specific proportion of samples, in an evenly distributed manner, simulates replacing a sensor having a particular sampling rate with a sensor having a lower sampling rate than the first sensor. Dropout simulation module 420 removes all samples in a particular time period, simulating an effect of a sensor failing to produce data in the time period.

Figure 5:
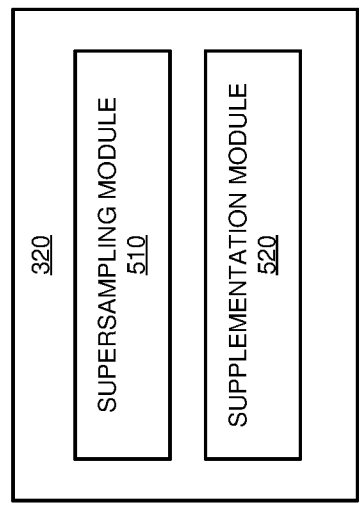
FIG. 5 depicts a block diagram giving more detail of an example configuration for sensor data manipulation using emulation in accordance with an illustrative embodiment.

With reference to FIG. 5, this figure depicts a block diagram giving more detail of an example configuration for sensor data manipulation using emulation in accordance with an illustrative embodiment. FIG. 5 gives more detail of sample deletion module 320 in FIG. 3.

Supersampling module 510 adds a specific proportion of the total number of samples, in an evenly distributed manner. Adding a specific proportion of samples, in an evenly distributed manner, simulates replacing a sensor having a particular sampling rate with a sensor having a higher sampling rate than the first sensor. Supplementation module 520 adds a measurement at a particular time or within a particular time period, introducing created sensor data for the consuming application to process. Introducing created data compensates for missing data or simulates an event.

Figure 6:
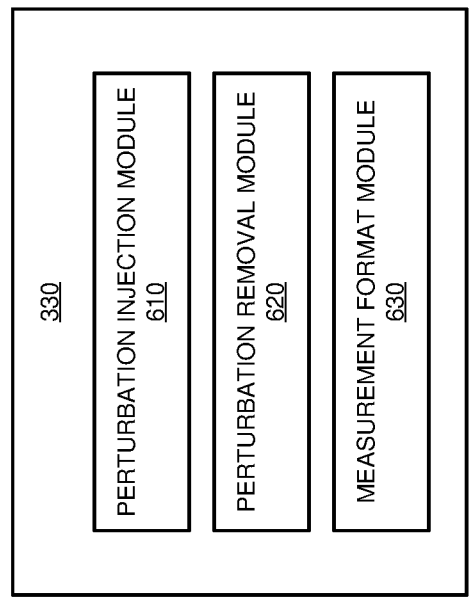
FIG. 6 depicts a block diagram giving more detail of an example configuration for sensor data manipulation using emulation in accordance with an illustrative embodiment.

With reference to FIG. 6, this figure depicts a block diagram giving more detail of an example configuration for sensor data manipulation using emulation in accordance with an illustrative embodiment. FIG. 6 gives more detail of sample deletion module 330 in FIG. 3.

Perturbation injection module 610 adds a perturbation to the value of a measurement, to simulate an effect of noise, interference, or another phenomenon that degrades measurement quality. Perturbation removal module 620 removes a perturbation from the value of a measurement, simulating removing noise, interference, or another phenomenon from a measurement, thus improving measurement quality. Measurement format module 630 modifies received sensor data by changing a format of a measurement within the sensor data, allowing substitution of a sensor supplying measurement data in one format with a sensor supplying measurement data in a different format without modifying the consuming application.

Figure 7:
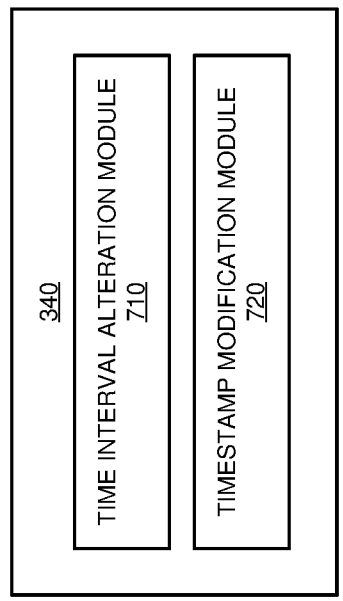
FIG. 7 depicts a block diagram giving more detail of an example configuration for sensor data manipulation using emulation in accordance with an illustrative embodiment.

With reference to FIG. 7, this figure depicts a block diagram giving more detail of an example configuration for sensor data manipulation using emulation in accordance with an illustrative embodiment. FIG. 7 gives more detail of sample deletion module 340 in FIG. 3.

Time interval alteration module 710 modifies the received data by changing a time interval between two samples. Expanding a time interval between two samples simulates an effect of lowering a frequency at which a sensor takes measurements. Contracting a time interval between two samples simulates an effect of raising a frequency at which a sensor takes measurements. Timestamp modification module 720 modifies a timestamp associated with a sample, simulating an effect of taking measurements at a different time.

Figure 8:
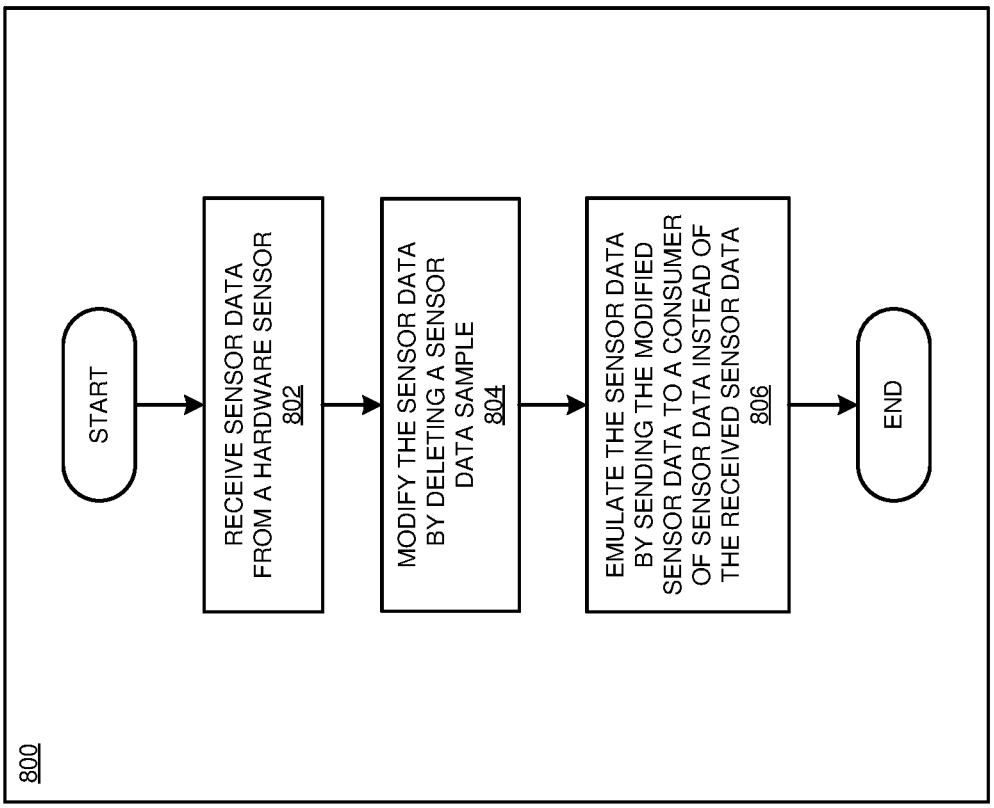
FIG. 8 depicts a flowchart of an example process for sensor data manipulation using emulation in accordance with an illustrative embodiment.

With reference to FIG. 8, this figure depicts a flowchart of an example process for sensor data manipulation using emulation in accordance with an illustrative embodiment. Process 800 can be implemented in application 300 in FIG. 3.

In block 802, the application receives sensor data from a hardware sensor. In block 804, the application modifies the sensor data by deleting a sensor data sample. In block 806, the application emulates the sensor data by sending the modified sensor data to a consumer of sensor data instead of the received sensor data. Then the application ends.

Figure 9:
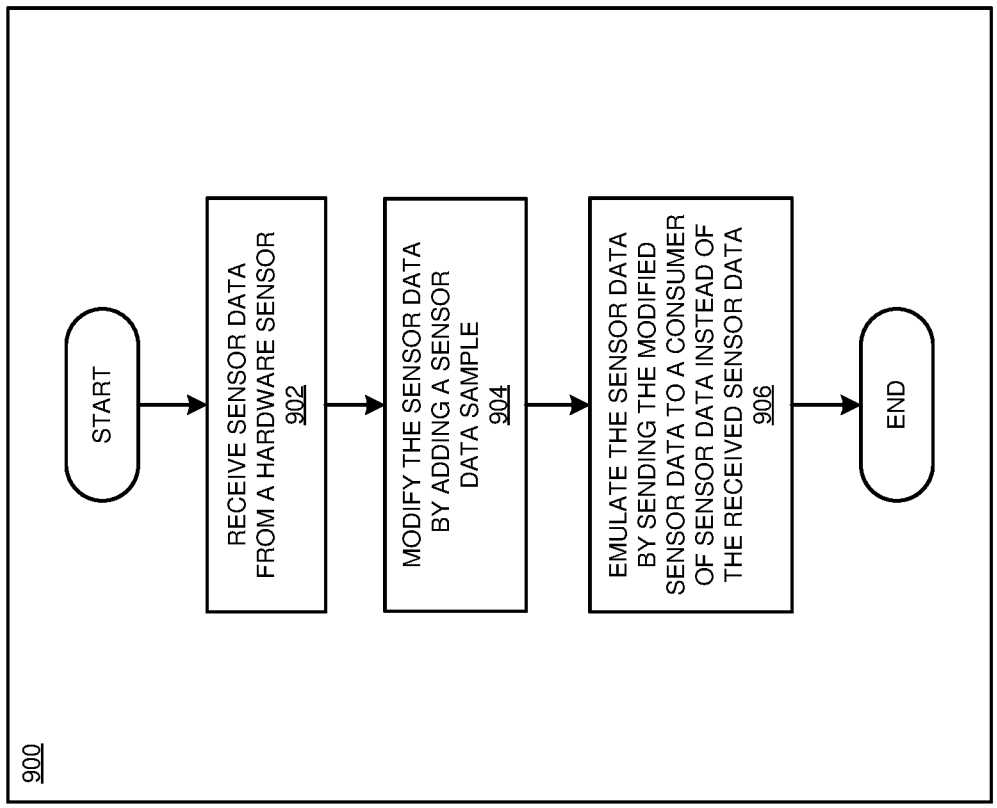
FIG. 9 depicts a flowchart of an example process for sensor data manipulation using emulation in accordance with an illustrative embodiment.

With reference to FIG. 9, this figure depicts a flowchart of an example process for sensor data manipulation using emulation in accordance with an illustrative embodiment. Process 900 can be implemented in application 300 in FIG. 3.

In block 902, the application receives sensor data from a hardware sensor. In block 904, the application modifies the sensor data by adding a sensor data sample. In block 906, the application emulates the sensor data by sending the modified sensor data to a consumer of sensor data instead of the received sensor data. Then the application ends.

Figure 10:
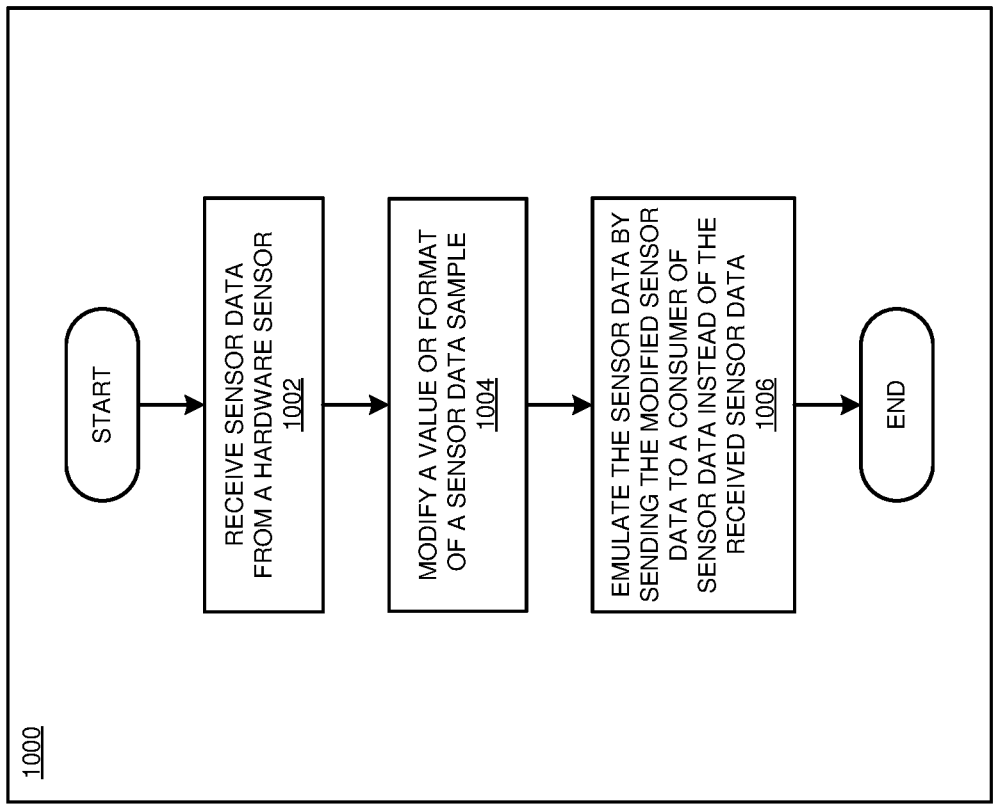
FIG. 10 depicts a flowchart of an example process for sensor data manipulation using emulation in accordance with an illustrative embodiment.

With reference to FIG. 10, this figure depicts a flowchart of an example process for sensor data manipulation using emulation in accordance with an illustrative embodiment. Process 1000 can be implemented in application 300 in FIG. 3.

In block 1002, the application receives sensor data from a hardware sensor. In block 1004, the application modifies a value or a format of a sensor data sample. In block 1006, the application emulates the sensor data by sending the modified sensor data to a consumer of sensor data instead of the received sensor data. Then the application ends.

Figure 11:
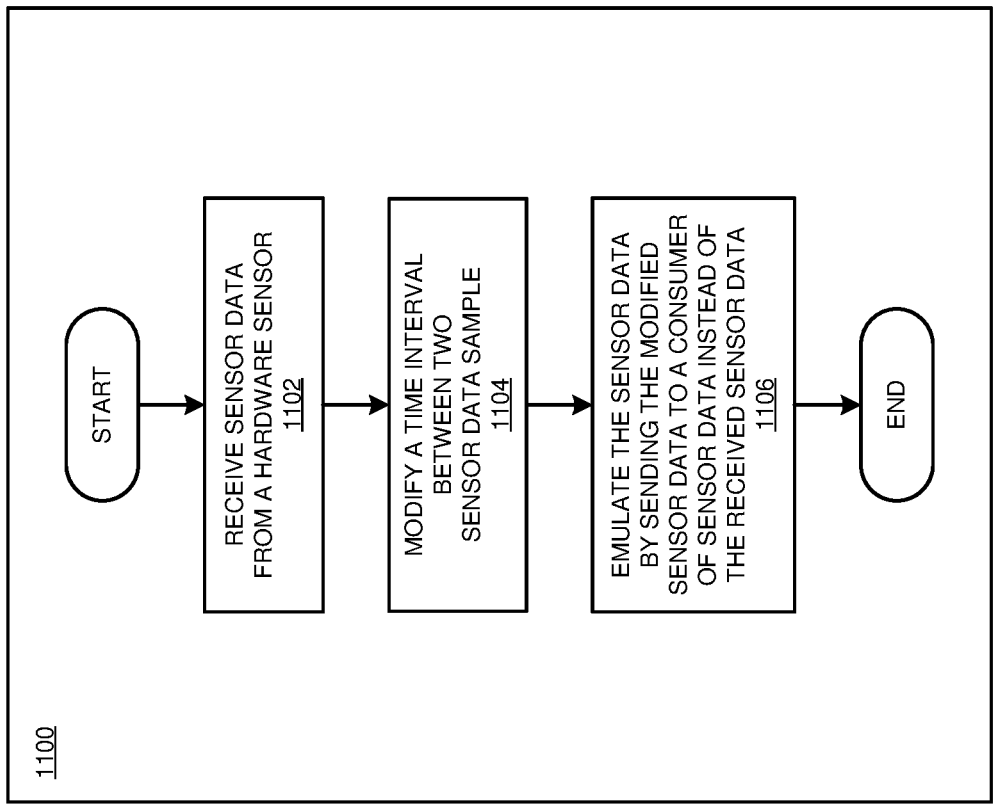
FIG. 11 depicts a flowchart of an example process for sensor data manipulation using emulation in accordance with an illustrative embodiment.

With reference to FIG. 11, this figure depicts a flowchart of an example process for sensor data manipulation using emulation in accordance with an illustrative embodiment. Process 1100 can be implemented in application 300 in FIG. 3.

In block 1102, the application receives sensor data from a hardware sensor. In block 1104, the application modifies a time interval between two sensor data samples. In block 1106, the application emulates the sensor data by sending the modified sensor data to a consumer of sensor data instead of the received sensor data. Then the application ends.

Figure 12:
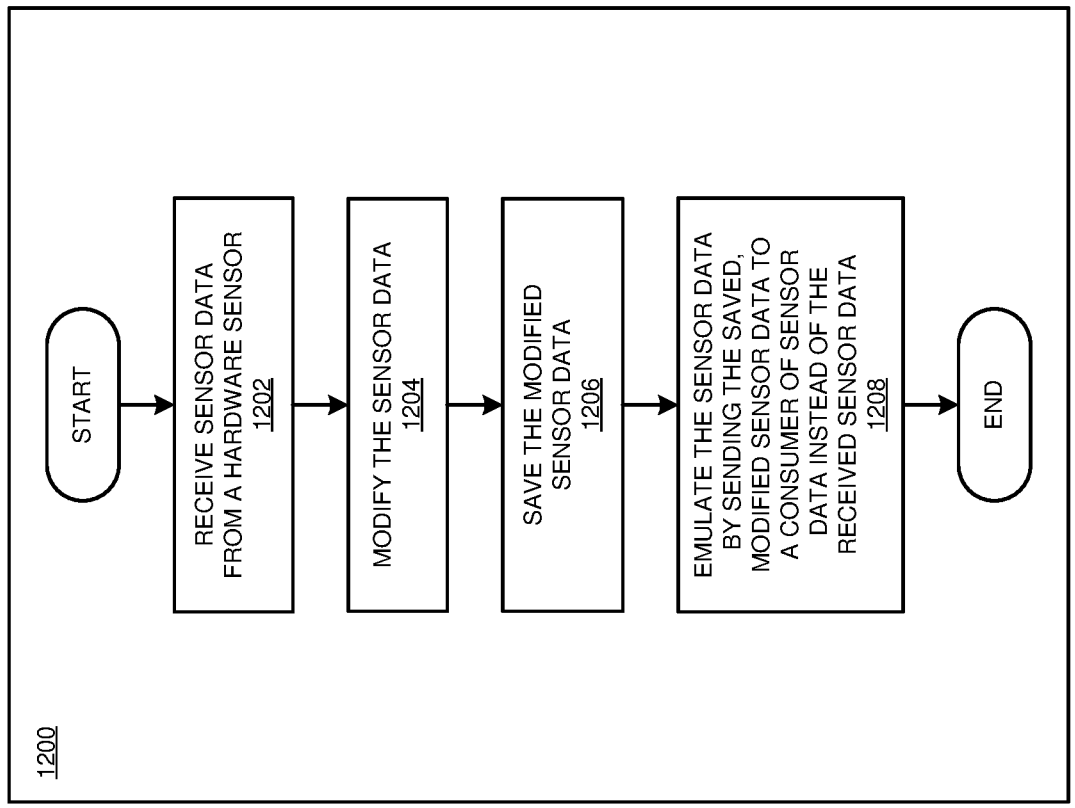
FIG. 12 depicts a flowchart of an example process for sensor data manipulation using emulation in accordance with an illustrative embodiment.

With reference to FIG. 12, this figure depicts a flowchart of an example process for sensor data manipulation using emulation in accordance with an illustrative embodiment. Process 1200 can be implemented in application 300 in FIG. 3.

In block 1202, the application receives sensor data from a hardware sensor. In block 1204, the application modifies the sensor data. In block 1206, the application saves the modified sensor data. In block 1208, the application emulates the sensor data by sending the modified sensor data to a consumer of sensor data instead of the received sensor data. Then the application ends.

Thus, a computer implemented method, system or apparatus, and computer program product are provided in the illustrative embodiments for sensor data manipulation using emulation and other related features, functions, or operations. Where an embodiment or a portion thereof is described with respect to a type of device, the computer implemented method, system or apparatus, the computer program product, or a portion thereof, are adapted or configured for use with a suitable and comparable manifestation of that type of device.

Where an embodiment is described as implemented in an application, the delivery of the application in a Software as a Service (SaaS) model is contemplated within the scope of the illustrative embodiments. In a SaaS model, the capability of the application implementing an embodiment is provided to a user by executing the application in a cloud infrastructure. The user can access the application using a variety of client devices through a thin client interface such as a web browser (e.g., web-based e-mail), or other light-weight client-applications. The user does not manage or control the underlying cloud infrastructure including the network, servers, operating systems, or the storage of the cloud infrastructure. In some cases, the user may not even manage or control the capabilities of the SaaS application. In some other cases, the SaaS implementation of the application may permit a possible exception of limited user-specific application configuration settings.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A method comprising:
receiving, over a computer network from a hardware sensor at a first time, sensor data comprising a first sample and a second sample;
modifying, to create new data, the sensor data, wherein a first data point of the new data comprises the first sample, a second data point of the new data comprises the second sample, and wherein the modifying comprises removing a specific proportion of the total number of samples received from the hardware sensor between the first sample and the second sample, wherein a time period between consecutive removed samples is a constant; and
emulating a second hardware sensor having a reduced sampling rate relative to the hardware sensor by sending, to a consumer of hardware sensor data at a second time, the new data instead of the sensor data.

2. The method of claim 1, wherein the modifying comprises changing a time interval between the first data point and the second data point, wherein the changing of the time period is accomplished without removing an intermediate sample from between the first sample and the second sample.

3. The method of claim 1, wherein the specific proportion of the total number of samples comprises all samples received from the hardware sensor between the first sample and the second sample.

4. The method of claim 1, wherein the modifying comprises modifying a timestamp associated with the first sample or the second sample.

5. A computer usable program product comprising one or more computer-readable storage devices, and program instructions stored on at least one of the one or more storage devices, the stored program instructions comprising:
program instructions to receive, over a computer network from a hardware sensor at a first time, sensor data comprising a first sample and a second sample;
program instructions to modify, to create new data, the sensor data, wherein a first data point of the new data comprises the first sample, a second data point of the new data comprises the second sample, and wherein the modifying comprises removing a specific proportion of the total number of samples received from the hardware sensor between the first sample and the second sample, wherein a time period between consecutive removed samples is a constant; and program instructions to emulate a second hardware sensor having a reduced sampling rate relative to the hardware sensor by sending, to a consumer of hardware sensor data at a second time, the new data instead of the sensor data.

6. The computer usable program product of claim 5, wherein the modifying comprises changing a time interval between the first data point and the second data point, wherein the changing of the time period is accomplished without removing an intermediate sample from between the first sample and the second sample.

7. The computer usable program product of claim 5, wherein the computer usable code is stored in a computer readable storage device in a data processing system, and wherein the computer usable code is transferred over a network from a remote data processing system.

8. The computer usable program product of claim 5, wherein the computer usable code is stored in a computer readable storage device in a server data processing system, and wherein the computer usable code is downloaded over a network to a remote data processing system for use in a computer readable storage device associated with the remote data processing system.

9. The computer usable program product of claim 5, wherein the specific proportion of the total number of samples comprises all samples received from the hardware sensor between the first sample and the second sample.

10. The computer usable program product of claim 5, wherein the modifying comprises modifying a timestamp associated with the first sample or the second sample.

11. A computer system comprising one or more processors, one or more computer-readable memories, and one or more computer-readable storage devices, and program instructions stored on at least one of the one or more storage devices for execution by at least one of the one or more processors via at least one of the one or more memories, the stored program instructions comprising:

program instructions to receive, over a computer network from a hardware sensor at a first time, sensor data comprising a first sample and a second sample;

program instructions to modify, to create new data, the sensor data, wherein a first data point of the new data comprises the first sample, a second data point of the new data comprises the second sample, and wherein the modifying comprises removing a specific proportion of the total number of samples received from the hardware sensor between the first sample and the second sample, wherein a time period between consecutive removed samples is a constant; and program instructions to emulate a second hardware sensor having a reduced sampling rate relative to the hardware sensor by sending, to a consumer of hardware sensor data at a second time, the new data instead of the sensor data.

\* \* \* \* \*